United States Patent
Heller

(10) Patent No.: US 10,784,173 B2
(45) Date of Patent: Sep. 22, 2020

(54) PROTON RADIATION AS A TOOL FOR SELECTIVE DEGRADATION AND PHYSICS BASED DEVICE MODEL TEST AND CALIBRATION

(71) Applicant: Government of the United States as Represented by the Secretary of the Air Force, Wright-Patterson AFB, OH (US)

(72) Inventor: Eric Heller, Kettering, OH (US)

(73) Assignee: United States of America as represented by the Secretary of the Air Force, Wright-Patterson AFB, OH (US)

(*) Notice: Subject to any disclaimer, the term of this patent is extended or adjusted under 35 U.S.C. 154(b) by 212 days.

(21) Appl. No.: 15/961,072

(22) Filed: Apr. 24, 2018

(65) Prior Publication Data

US 2018/0308771 A1    Oct. 25, 2018

Related U.S. Application Data

(60) Provisional application No. 62/488,899, filed on Apr. 24, 2017.

(51) Int. Cl.
    *H01L 29/00*     (2006.01)
    *H01L 21/66*     (2006.01)
    (Continued)

(52) U.S. Cl.
    CPC ............ *H01L 22/14* (2013.01); *H01L 21/263* (2013.01); *H01L 23/552* (2013.01);
    (Continued)

(58) Field of Classification Search
    CPC .. H01L 23/552; H01L 21/263; H01L 29/7787
    See application file for complete search history.

(56) References Cited

U.S. PATENT DOCUMENTS

| | | | | |
|---|---|---|---|---|
| 5,571,748 A | * | 11/1996 | Miyazawa | ............. B82Y 20/00 |
| | | | | 257/E21.09 |
| 6,452,221 B1 | * | 9/2002 | Lai | ...................... H01L 29/7787 |
| | | | | 257/192 |

(Continued)

OTHER PUBLICATIONS

V. Penso, "GaN or GaAs, TWT or Klystron—Testing High Power Amplifiers for RADAR Signals using Peak Power Meters," Boonton Application Note, Wireless Telecom Group, Inc. (2015), available at http://boonton.com/resource-library/white-papers/gan-or-gaas-twt-or-klystron-testing-high-power-amplifiers-for-radar-signals-using-peak-power-meters, 8 pages total.

(Continued)

*Primary Examiner* — Alvaro E Fortich
(74) *Attorney, Agent, or Firm* — AFMCLO/JAZ; Chastity D. S. Whitaker

(57) ABSTRACT

A method of evaluating localized degradation of a III-V compound semiconductor. The method includes preparing first and second III-V compound semiconductors. The second III-V compound semiconductor that is similar to the first III-V compound semiconductor and further comprises a shield layer that is configured to alter exposed portions of channels of the second III-V compound semiconductor. The first and second III-V compound semiconductors and irradiated and then electrically tested. Results of the electrical testing of the first and second III-V compound semiconductors are compared.

20 Claims, 9 Drawing Sheets

(51) Int. Cl.
*H01L 29/778* (2006.01)
*H01L 21/263* (2006.01)
*H01L 23/552* (2006.01)
*H01L 29/40* (2006.01)
*H01L 29/20* (2006.01)

(52) U.S. Cl.
CPC .......... *H01L 29/7787* (2013.01); *H01L 22/34* (2013.01); *H01L 29/2003* (2013.01); *H01L 29/402* (2013.01); *H01L 29/7786* (2013.01)

(56) References Cited

U.S. PATENT DOCUMENTS

| | | | |
|---|---|---|---|
| 2011/0001163 A1* | 1/2011 | Sasaki | H01L 33/007 257/103 |
| 2014/0264369 A1* | 9/2014 | Padmanabhan | H01L 29/7787 257/76 |
| 2015/0236122 A1* | 8/2015 | Ren | H01L 29/66462 257/76 |
| 2015/0340483 A1* | 11/2015 | Briere | H01L 29/404 257/194 |
| 2016/0141274 A1* | 5/2016 | Or-Bach | H01L 23/36 257/659 |

OTHER PUBLICATIONS

J. Chen et al., "Proton-induced dehydrogenation of defects in AlGaN/GaN HEMTs," IEEE Trans. Nuclear Sci., vol. 60 (2013) 4080-4086.

E. Heller, "Simulation of life testing procedures for estimating long-term degradation and lifetime of AlGaN/GaN HEMTs," IEEE Trans. Electron Dev., vol. 55 (2008) 2554-2560.

E. Heller et al., "Electro-thermal modeling of multifinger AlGaN/GaN HEMT device operation including thermal substrate effects," Microelect. Reliability, vol. 48 (2008) 45-50.

E. Heller et al., "Electrical and structural dependence of operating temperature of AlGaN/GaN HEMTs," Microelect. Reliability, vol. 53 (2013) 872-877.

A. Kalavagunta et al., "Electrostatic mechanisms responsible for device degradation in proton irradiated AlGaN/AlN/GaN HEMTs," IEEE Trans. Nuclear Sci., vol. 55 (2008) 2106-2112.

R. S. Pengelly et al., "A review of GaN on SiC high electron-mobility power transistors and MMICs," IEEE Trans. Microwave Theory and Techniques, vol. 60 (2012) 20 pages total.

M. Shandas, "TWTs still drive high-power systems," Microwaves & RF, ED Online ID #21520 (2009), available at http://www.mwrf.com/components/twts-still-drive-high-power-systems, 4 pages total.

J. D. Albrecht et al., "Electroon transport characteristics of GaN for high temperature device modeling," J. Appl. Phys., vol. 83 (1998) 4777-4781.

Y. S. Puzyrev et al, "Radiation-Induced Defect Evolution and Electrical Degradation of AlGaN/GaN High-Electron-Mobility Transistors," IEEE Trans Nuclear Sci., vol. 58 (2011) 2918-2914.

L. Lv et al., "Study of proton irradiation effect on AlGaN/GaN high electron mobility transistors," Microelectron. Reliabl., vol. 51 (2011) 2168-2172.

T. Roy et al. "Process dependence of proton-induced degradation in GaN HEMTs," IEEE Trans. Nuclear Sci., vol. 57 (2010) 3060-3065.

H.-Y. Kim et al., "Optical and electrical characterization of AlGaN/GaN high electron mobility transistors irradiated with 5 MeV protons," J. Cryst. Growth, vol. 326 (2011) 62-64.

* cited by examiner

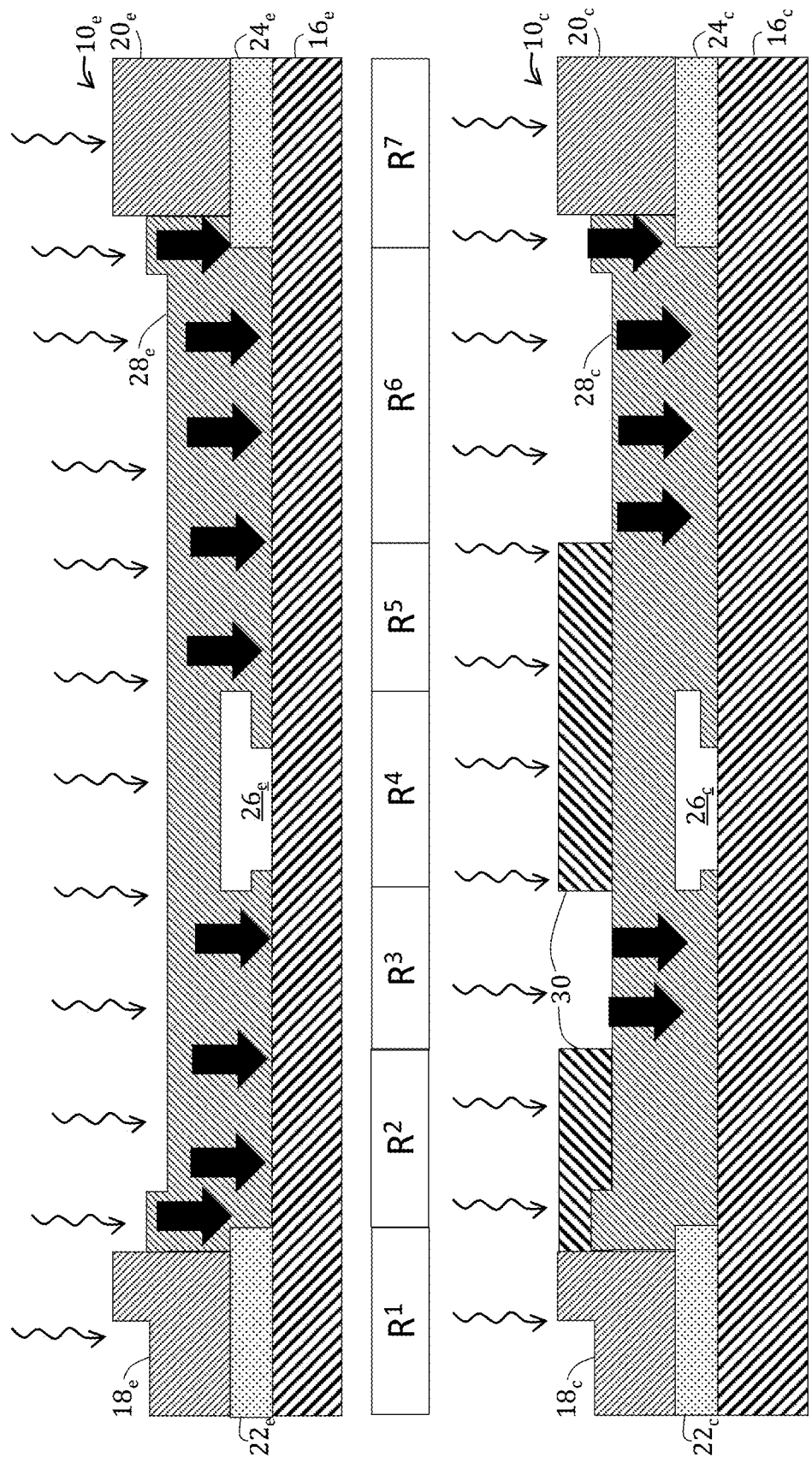

PROTON RADIATION AS A TOOL FOR SELECTIVE DEGRADATION AND PHYSICS BASED DEVICE MODEL TEST AND CALIBRATION

Pursuant to 37 C.F.R. § 1.78(a)(4), this application claims the benefit of and priority to prior filed Provisional Application Ser. No. 62/488,899, filed 24 Apr. 2017, which is expressly incorporated herein by reference in its entirety.

RIGHTS OF THE GOVERNMENT

The invention described herein may be manufactured and used by or for the Government of the United States for all governmental purposes without the payment of any royalty.

FIELD OF THE INVENTION

The present invention relates generally to electrical device degradation and, more particularly, to devices, models, and methods for evaluating electrical device degradation.

BACKGROUND OF THE INVENTION

Gallium Nitride (GaN) High Electron Mobility Transistors ("HEMTs") for RF/microwave signal amplification are expected to replace GaAs and Traveling Wave Tubes ("TWTs") for many applications due to advantages such as size, weight, efficiency and peak operating temperature. GaN is inherently different than other conventional technologies. For example, when compared to GaAs HEMTs, the nearest analogous technology, GaN HEMTs support roughly eight-times the electric field and ten-times the power density per unit gate width. GaN materials rely on polarization charge and piezoelectric charge for an origin of channel electrons rather than electron donors. Also, GaN materials contain many orders of magnitude more threading dislocations per unit area.

Investigations involving the effects of GaN proton HEMT irradiation have focused on irradiating the whole device with mixed findings at high doses. Threshold voltage shift, Schottky barrier height ("SBH"), and others point to physical effects at the gate; on-state drain current decrease and (closely related) greater on-resistance point to effects at the channel regions.

A fundamental understanding of long term effects in GaN devices requires an ability to predictively model the physics of the different regions of the device. Thus, there remains a need for devices, models, and methods that are configured to evaluate the effects of irradiation on GaN HEMT-based structures.

SUMMARY OF THE INVENTION

The present invention overcomes the foregoing problems and other shortcomings, drawbacks, and challenges of understanding the effects of irradiation on GaN HEMT-based structures. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention includes a method of evaluating localized degradation of a III-V compound semiconductor by preparing first and second III-V compound semiconductors. The second III-V compound semiconductor that is similar to the first III-V compound semiconductor and further comprises a shield layer that is configured to alter exposed portions of channels of the second III-V compound semiconductor. The first and second III-V compound semiconductors and irradiated and then electrically tested. Results of the electrical testing of the first and second III-V compound semiconductors are compared.

Other embodiments of the present invention include a method of evaluating localized degradation of a III-V compound semiconductor by preparing first and second III-V compound semiconductors. The second III-V compound semiconductor that is similar to the first III-V compound semiconductor and further comprises a shield layer that is configured to alter exposed portions of channels of the second III-V compound semiconductor. The first and second III-V compound semiconductors and irradiated and then electrically tested. Results of the electrical testing of the first and second III-V compound semiconductors are compared, and, using a processor, results of the electrical testing of the first and second III-V compound semiconductor are modeled so as to fit the results to physical properties of the exposed portions of the channel.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIGS. 3A and 3B are similar to FIG. 2 but illustrate alternative embodiments of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 1:
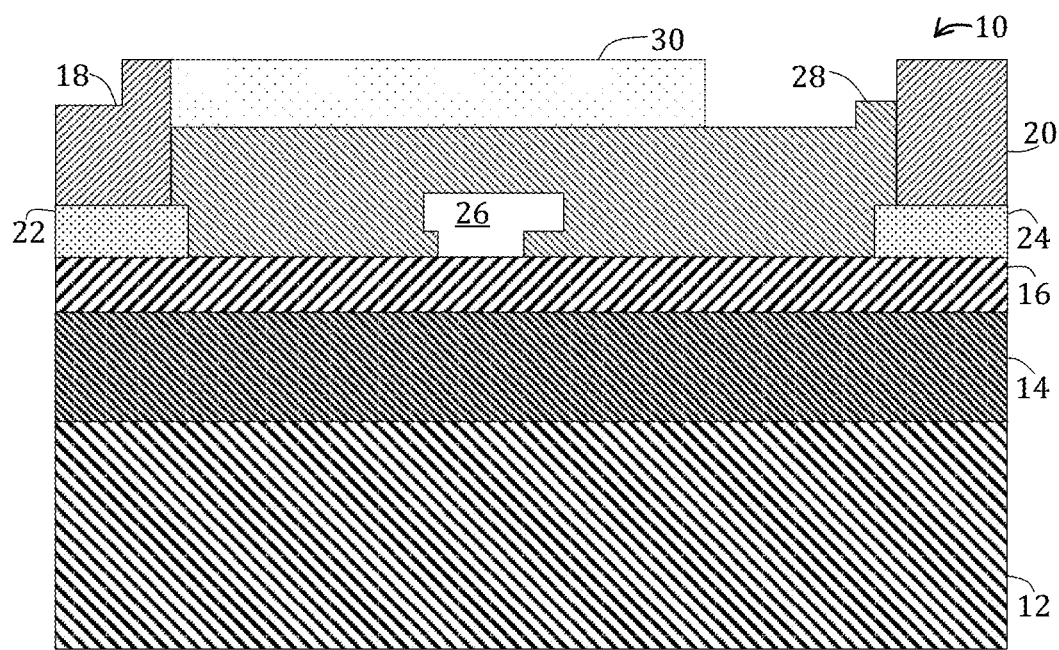
FIG. 1 is a schematic illustration, in cross-section, of GaN HEMT according to embodiments of the present invention.

Referring now to the figures, and in particular to FIG. 1, a Gallium Nitride (GaN) High Electron Mobility Transistor ("HEMT") 10 according to an embodiment of the present invention is shown. While the specific illustrative embodiment is shown as a HEMT it would be readily appreciated by those having ordinary skill in the art that other embodiments may include any one of various III-V compound semiconductors having superficial charge movement. Suitable III-V compound semiconductors may include field-effect transistors ("FET") or related devices. FET devices include those transistors that use an electric field to control behavior of the device and generally include three terminals: a source (the terminal through which carriers or charges enter the channel), a drain (the terminal through which the carriers or charges leave the channel), and a gate (the terminal that modulates channel conductivity). For instance, embodiments and aspects of the present invention may be easily applied to junction gate field-effect transistors ("JFET"), metal-oxide semiconductor field-effect transistors ("MOSFET") and so forth. However, for the sake of simplicity, embodiments illustrated herein are shown as applied to HEMT, which is a particular species of the FET genus.

The HEMT 10 of FIG. 1 includes a substrate 12 (such as constructed from SiC or other silicon- or semiconductor-based materials), a gallium nitride (GaN) barrier layer 14, and an aluminum gallium nitride (AlGaN) barrier layer 16 deposited thereon. The interface between the GaN barrier layer 14 and the AlGaN barrier layer 16 is the location in which a 2DEG may develop during operation of the HEMT 10. Device structures are then grown atop the AlGaN barrier layer 16 and may include a source 18 and a drain 20 (each with respective capping layers 22, 24, if desired or necessary for function), a gate 26, and, optionally, a dielectric layer 28 grown over the gate and between the source and drain.

Figure 2:
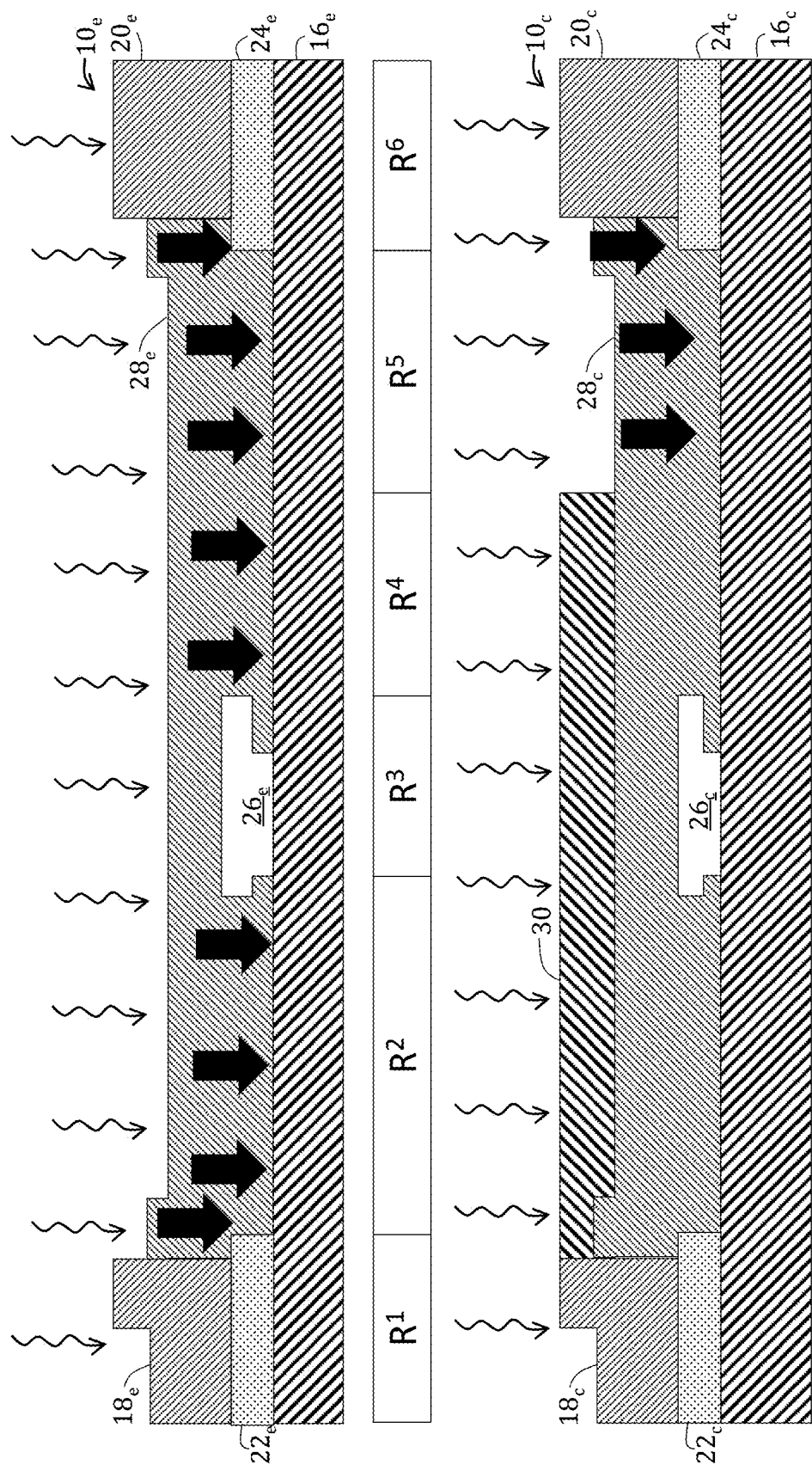
FIG. 2 illustrates first and second GaN HEMTs according to embodiments of the present invention for irradiation to induce damage thereon.

For evaluating effects of proton irradiation, two HEMT devices $10_e$, $10_c$, partially illustrated in FIG. 2, may be evaluated: a first HEMT $10_e$ (otherwise referred to as an "experimental device") having a structure similar to FIG. 1 as described above (reference numerals using a subscript "e"), and a second HEMT $10_c$ (otherwise referred to as a "control device") that is similar to FIG. 1 (reference numerals using a subscript "c") and that further includes an optional shield layer 30 may be grown atop the dielectric layer $28_e$ and extend over the channel from the source $18_e$ to an area between the gate $26_c$ and the drain $20_c$. While construction and parameters of the shield layer 30 may vary, generally the shield layer 30 may be constructed from a material and of such thickness that it is resistant to proton irradiation and minimizes straggle. Exemplary materials may include those of high density and high atomic number materials (metals, such as gold or platinum, or dielectrics, such as $HfO_2$). The material comprising the shield layer 30 and the thickness thereof should be of such physical size that a size of exposed and shielded regions of the channel are small as compared to a size of the electrically active regions of the HEMT $10_e$. The exposed regions of the channel may coincide with one or more regions of interest for which effects due to degradation are investigated.

For some embodiments of the present invention, the shield layer may be a multi-layered structure with layering deposition of the same or different materials.

In other embodiments, additional HEMTs may be included with varying layouts or arrangements of the shield layer so as to add fidelity to data collected.

According to one particular embodiment of the present invention, the shield layer 30 may be a source field plate ("SFP"), a source connected field plate ("SCFP"), or other structure designed to mitigate high electric fields or high temperatures in a nearby or adjacent semiconducting region.

Figure 6:
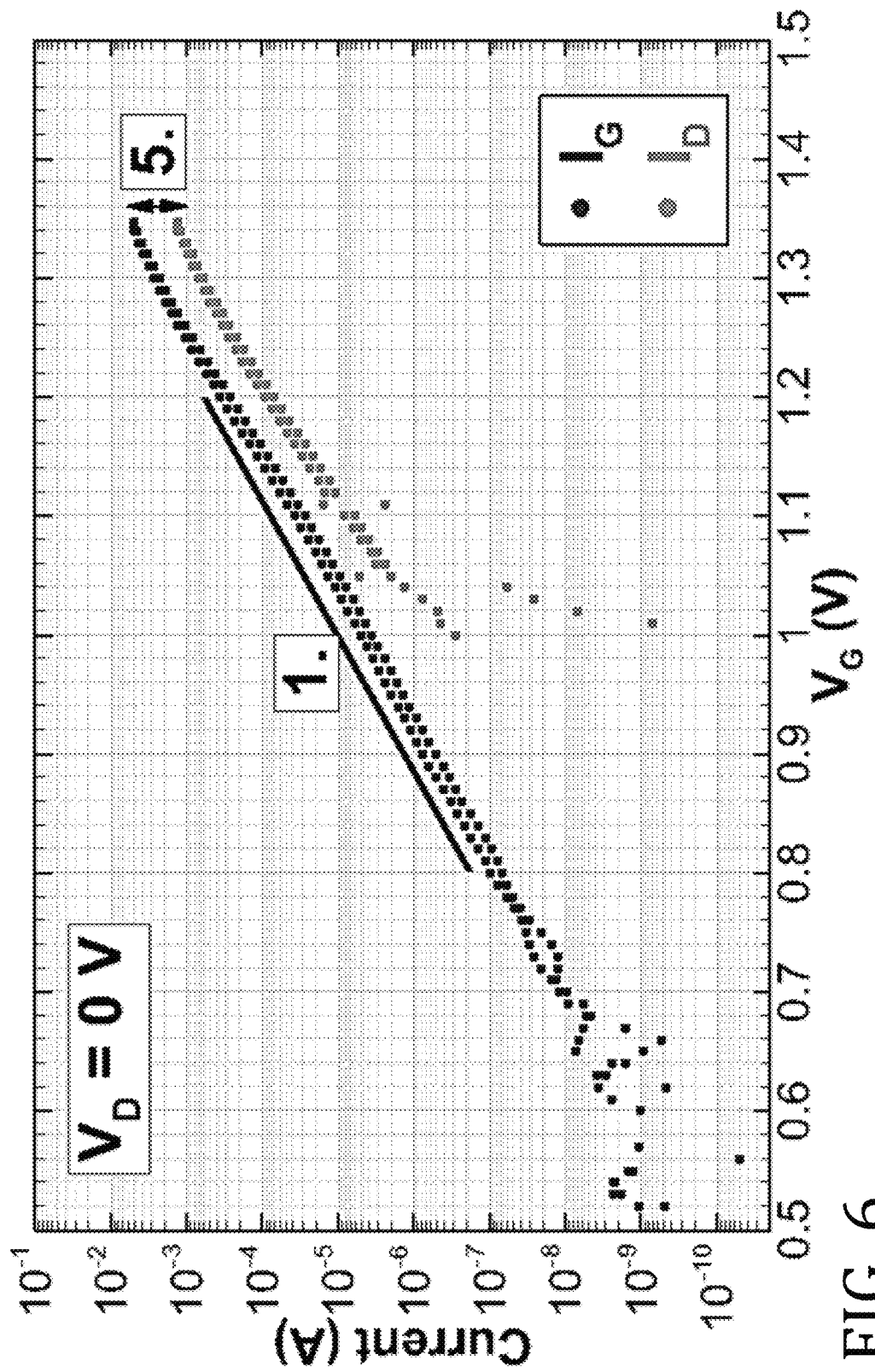
FIG. 6 graphically illustrates diode turn-on curves comparing gate and drain current as the gate is swept positive at 0 V on drain.
Figure 7:
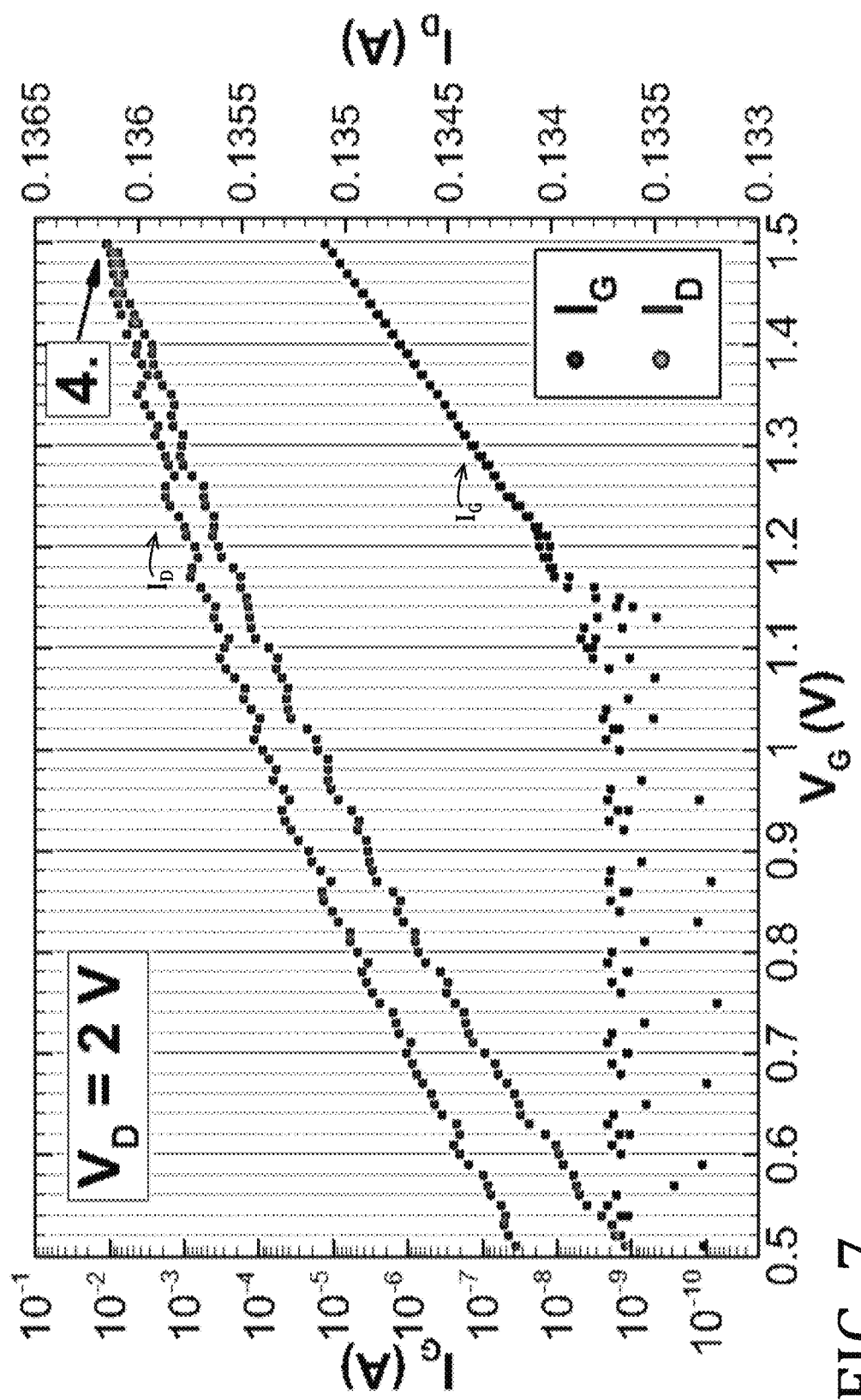
FIG. 7 graphically illustrates diode turn-on curves comparing gate and drain current as the gate is swept positive at 2 V on drain.

The shield layer 30 does not have a considerable direct electrical or thermal effect at modest biases, but may be configured to alter portions of the channel that may be exposed to irradiation. A small electrical effect that does not greatly alter the character of device operation (e.g., the size or location of a depletion zone) will not present issue with the observed and calculated affects. Notably, the electrical testing (as shown in FIGS. 6 and 7) was conducted at voltages that were well below where the shield layer would electrically and/or electrostatically fully deplete the underlying channel.

The first and second HEMTs $10_e$, $10_e$, prepared as shown in FIG. 2, may be divided into six evaluation regions: ($R^1$) a source region, ($R^2$) a first channel region, ($R^3$) a gate region, ($R^4$) a second channel region, ($R^5$) a third channel region, and ($R^6$) a drain region. The length and quantity of each region may vary and depends on the size and presence of certain elements. For example, lengths of the source and drain regions $R^6$ depend on whether capping layers $22_e$, $22_e$, $24_e$, $24_e$ are included with the source 18 and drain 20. Lengths of the first, second, and third channel regions $R^2$, $R^3$, $R^4$ depend on presence and length of the shield layer 30.

Figure 3A:
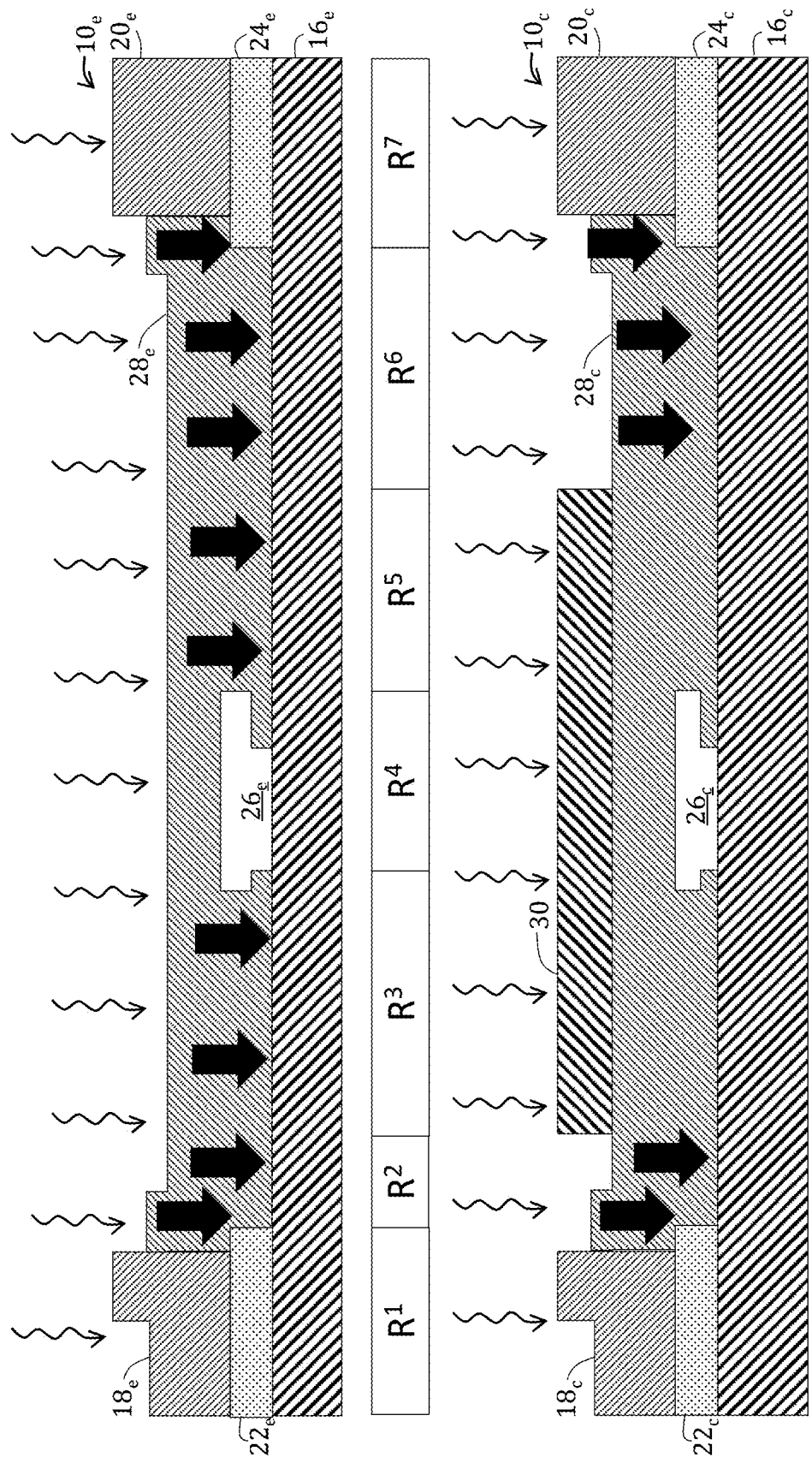

FIGS. 3A and 3B illustrate still other embodiments of the present invention in which the shield layers $30_e$ are shown as being spaced away from the source and split into first and second sections, respectively. Of course, other arrangements of the shield layer may be possible and should not be limited to those specifically illustrated herein, but instead depend on the pieces of the electrical device to be investigated while not interfering with the electrical properties of the device, itself. So long as the dielectric beneath the shield layer 30 is of sufficient thickness, the shield layer 30 is not anticipated to alter the electrical properties too much for the voltages used to query the health of the HEMT. Tailoring the layout and design of the shield layer 10 could enable a cleaner signal with better sensitivity.

Returning again to FIG. 2, irradiation of the first and second HEMTs $10_e$, $10_c$ so as to simulate localized damage is shown. The irradiation may include, for example, proton bombardment, ion bombardment, electron beams, and so forth with the proviso that the energy level of the irradiation is such that delineation between exposed and shielded regions remains sharp and relatively free of straggle, so that the electrical effects of the irradiation are dominated by the unshielded, exposed regions. Those of ordinary skill in the art will readily appreciate, given the disclosure herein, that the energy level of the irradiation will thus depend on both type and thickness of material comprising the shield layer 30. As shown, low energy proton beams (illustrated as lines 32) may be directed toward each of the first and second HEMT $10_e$, 10, Irradiation may continue to a desired period of time such that levels of degradation may be evaluated.

The period of time for irradiation may range from a few seconds to several hours, depending on the desired level of degradation and an energy level or power of the irradiation.

Irradiation of the first and second HEMTs $10_e$, $10_e$ thus yields different effects in each of the evaluation regions that may be compared for analyzing damage due to the irradiation. For instance, and unlike conventional testing methods, selective drain and source shielding enables separate evaluation of drain and source resistance degradation due to irradiation. As an example, a change in ohmic contact resistance may be quantified, separately, for the drain and the source.

After irradiation of both of the first and second HEMT $10_e$, $10_e$, performance of each may be evaluated. Performance may include diode turn-on at various drain biases relative to a ground source, gate capacitance as a function of gate voltage at various drain biases relative to a grounded source, radiofrequency large or small signal parameters, IV family, Hall effect, subthreshold slope/swing, biased-light emission, and other methods may be used. Exemplary performance evaluating electrical techniques will, when evaluated together, allow the degradation of some regions of the device to be separated from degradation of other regions, but are also low enough voltage and power so that thermal or field-effect properties of the shield are not too complicated to be accounted.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 4:
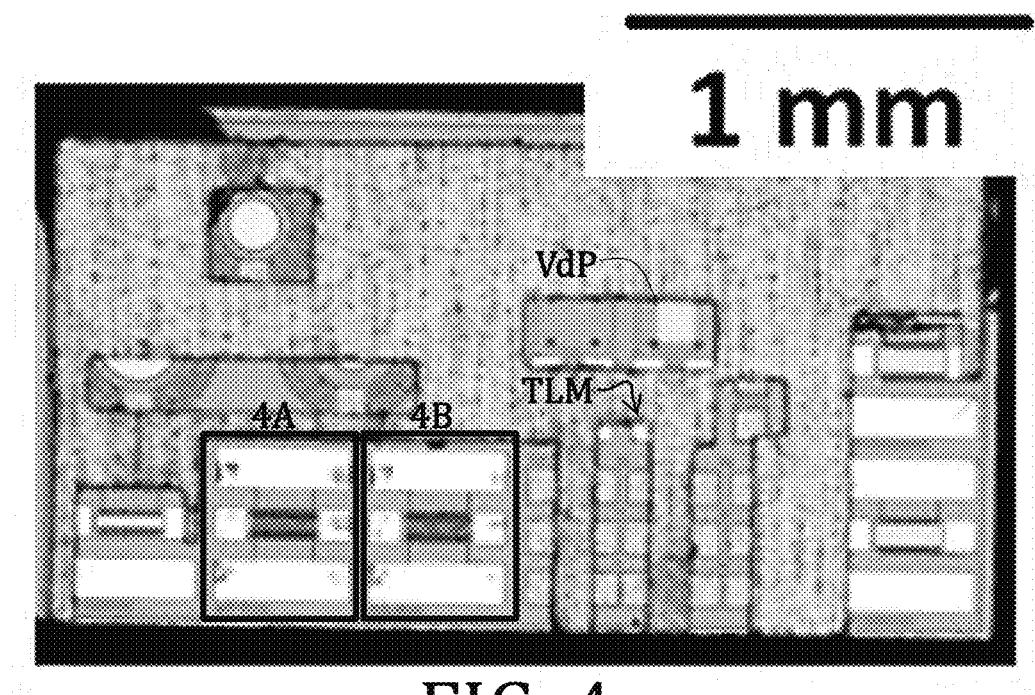
FIG. 4 is an image of a commercially-available, fabricated test chip reticle that includes first and second HEMTs according to embodiments of the present invention.
Figure 4A:
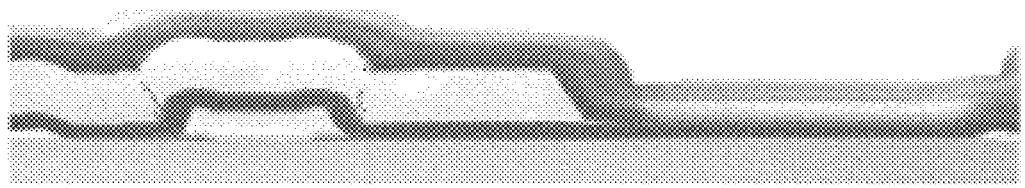
FIGS. 4A and 4B are images of the first and second HEMTs, control and experiment HEMTs, respectively.
Figure 4B:
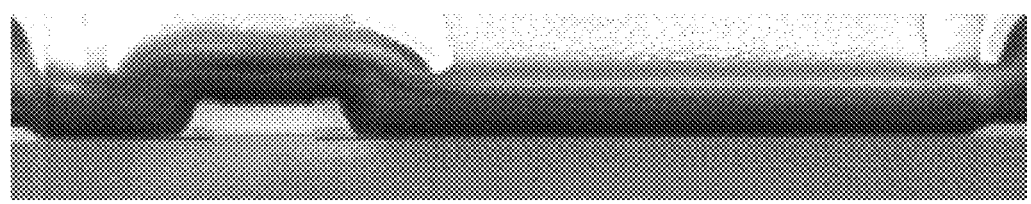

FIG. 4 schematically illustrates a commercially-available, fabricated test chip reticle that includes two, side-by-side, HEMTs for RF/microwave signal amplification, similar to those schematically illustrated in FIG. 1. One HEMT, a control transistor, include a shield layer while the other HEMT, an experiment transistor, did not include the shield layer (specifically a SCFP) (SEM images provided in FIGS. 4A and 4B, respectively). The shield layer of the control transistor was expected to aid in depleting the channel for higher breakdown voltage and, at high power dissipation, slightly improves the heat dissipation properties of the HEMT. The shield layer does not have a significant direct electrical or thermal effect at modest bias levels. As such, the shield layer was useful for altering portions of the channel of the HEMT that were exposed to protons.

Each reticle also included basic process monitor structures, such as Van der Pauw ("VdP") and Trasmission Line Method ("TLM") structures. The VdP structures enable an evaluation of Hall effect channel carrier concentration and mobility measurement. The VdP structures had a SiN passivated channel structure, similar to the passivated channel of each of the HEMT. Thus, inclusion of the VdP structures enabled un-irradiated and the as-measured irradiated degradation in carrier mobility and sheet carrier density as inputs to the model of the exposed portions of HEMT.

The TLM structures may be used to determine the specific contact resistivity according to conventional methods. The conventional method may be augmented to verify that ohmic characters of the control and experiment HEMTs are different post-irradiation.

Each reticle was irradiated with 150 keV protons at AEDC STAT (Arnold AFB, TN) while electrically floating to $2.8 \times 10^{13}$ cm$^{-2}$ and $6.8 \times 10^{14}$ cm$^{-2}$ estimated fluence with varying dose rate and over time periods ranging from a few hrs to about 10 hrs. Components of each reticle were then electrically tested for DC electrical outputs and tested for performance in three regions of each HEMT: (1) a first region extending from the source to the channel beneath the gate, (2) a second region beneath the gate, and (3) a third region extending from beneath the gate to the drain.

Figure 5:
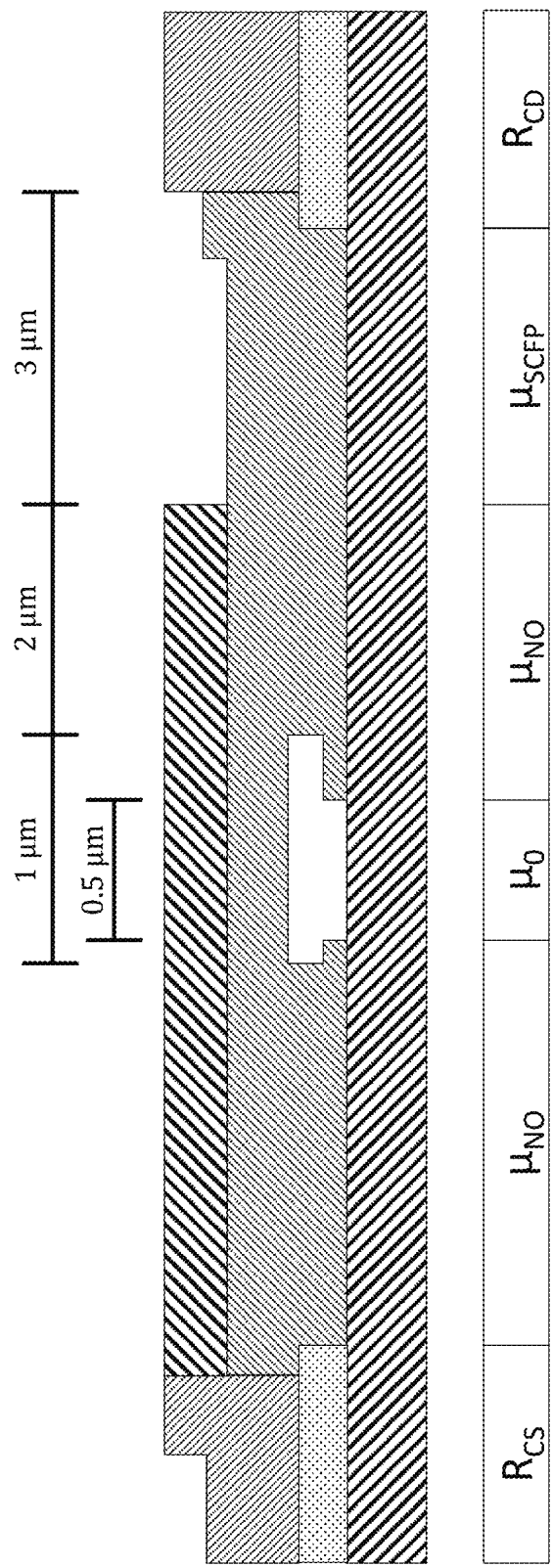
FIG. 5 is a partial schematic illustration, in cross-section, of the first and second HEMTs of FIGS. 4A and 4B.

FIG. 5 illustrates areas of measured damage to the channel (quantitatively measured from Hall effect), and the postulated damage affecting the ohmic contact resistance (qualitatively confirmed through failure analysis) were used as inputs to the physics based model, described below. Six quasi-separate parameters were collected from each HEMT: (1) $I_G$-$V_G$ slope, related to diode ideality factor; (2) $I_G$ turn-on, related to Schottky barrier height and diode Richardson constant; (3) Delta between $I_G$ turn-on, related to drain induced barrier lowering and is described from a shift in $I_G$ curves (difference between data represented in FIGS. 6 and 7); (4) maximum ID, related to resistance for fully-on device (when $V_G$=2 V); (5) $I_G$:$I_D$ at $V_G$=0 V; and (6) on resistance for partially-on device ($V_G$=0 V) collected but not shown in these figures.

FIGS. 6 and 7 graphically illustrate diode turn-on curves comparing gate and drain current ($I_G$ and $I_D$, respectively) as gate is swept positive at 0 V on drain (FIG. 6) and at 2 V (FIG. 7).

Figure 8:
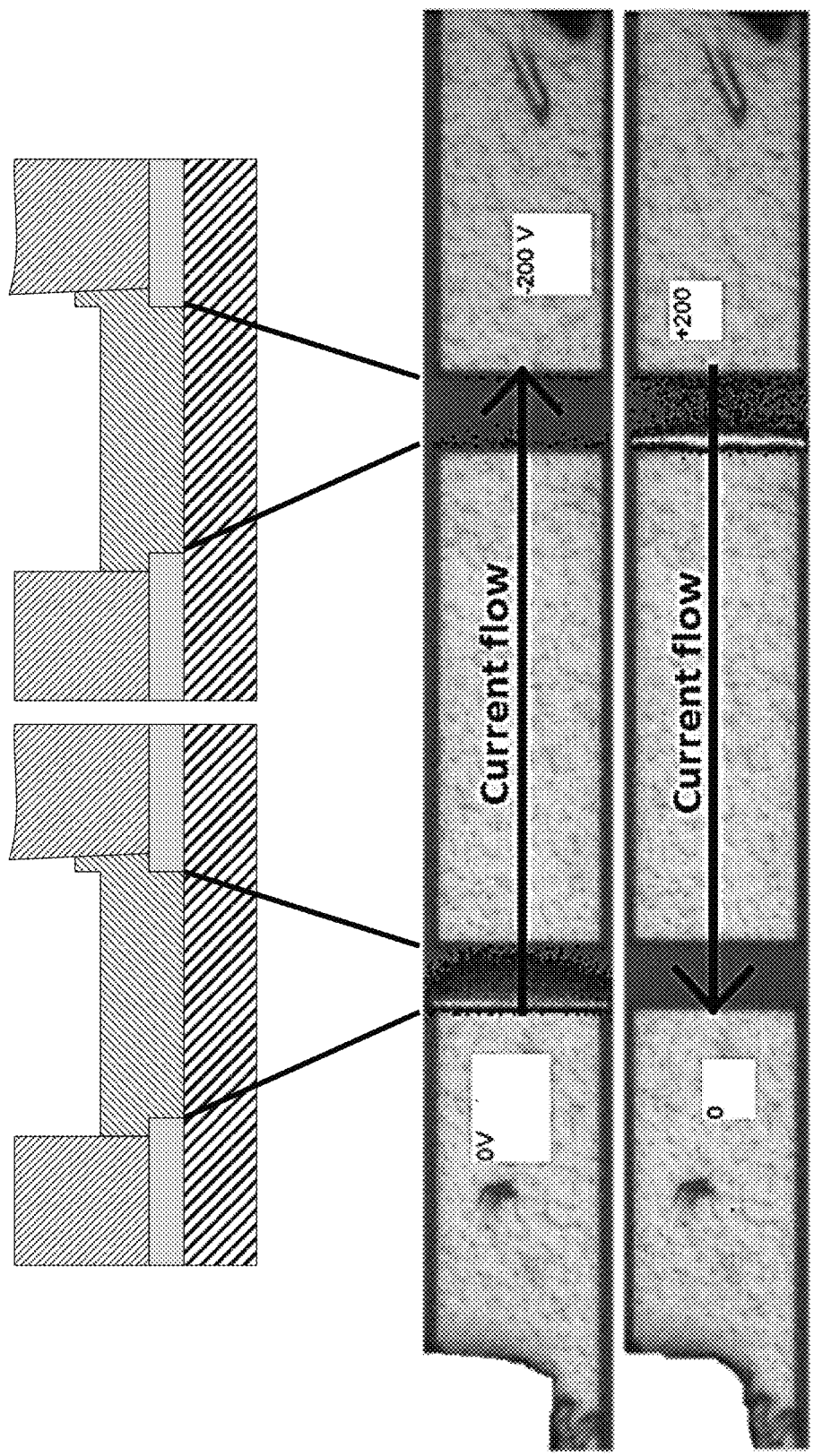
FIG. 8 illustrates operation of a Transmission Line Method ("TLM") test structure with light emission when high voltage is applied.

FIG. 8 illustrates operation of the TLM, wherein light was emitted from the highly resistive TLM structures when high voltage was applied voltage after 6.8e14 cm$^{-2}$ proton irradiation. Each TLM structure included a series of two HEMT structures minus the gates (see top portion of FIG. 8). Before irradiation, resistance was low resistance; after irradiation, a 30 μA current flowed, each direction, with a 200 V applied bias. No light was observed at this same level of current for an unirradiated structure.

From the TLM structure data, the ohmic contacts were found to be very resistive, and the source and drain are not the same post-irradiation but have significant rectifying behavior (as demonstrated by asymmetric light emission signature in FIG. 8). The light emission signature was a qualitative gauge that aids in demonstrating that, post-irradiation, the source and the drain ohmics are different in respective resistivity. This data lends evidence that quantitative, separate measures of source and drain ohmic contact resistances yielded different values for the two contacts.

A physics based model of the HEMTs was developed in Sentaurus Device (Synopsys Inc.) and used for solving the fully coupled solution of the drift-diffusion equations for carrier transport, Poisson for charging, and thermal diffusivity equation for temperature effects self-consistently. Inputs included temperature dependent low- and high-field electron mobility fitted to data from J. D. ALBRECHT et al., "Electron transport characteristics of GaN for high temperature device modeling," J. Appl. Phys., Vol. 83 (1998) 4777-4781, except that the mobility was adjusted in accordance with Matthiessen's rule so that the low field value was 1630 cm$^2$V$^{-1}$s$^{-1}$ (extracted from Hall effect measurements on unirradiated Van der Pauw test patterns). Otherwise, parameters were set through prior work.

Electron effective masses, temperature dependent thermal conductivity, trap distributions in all the layers, dielectric constants, heat capacities, temperature- and mole-fraction dependent semiconductor band gaps including band bending, and ohmic contact resistances were set through measurements using the TLM structures as described in E. R. HELLER, "Simulation of life testing procedures for estimating long term degradation and lifetime of AlGaN/GaN HEMTs," IEEE Trans. Electron Devices, Vol. 55 (2008)

2554-2560; and E. R. HELLER et al., "Electro-thermal modeling of multifinger AlGaN/GaN HEMT device operation including thermal substrate effects," Microelectron. Reliab., Vol. 48 (2008) 45-50.

The difference in spontaneous and polarization charge between AlGaN and GaN defines the charge at that interface which draws electrons to the channel, not donor dopants. This was set according to O. AMBACHER et al., "Pyroelectric properties of Al(In)GaN/GaN hetero- and quantum well structures," J. Phys. Condens. Matter, Vol. 14 (2002) 3399-3434, but adjusted a few percent to allow for device to device variation.

As a practical matter, GaN devices vary in their properties (particularly threshold voltage) for nominally identical parts. After a one-time adjustment, the same value was used throughout.

For simplicity, damage was assumed to be a step function with no partial shadowing effects or secondary scattering resulting from the shield layer.

In the process of comparing model and experimental data, it was found that ohmic contact resistance had to be increased and the outputs aligned. This introduced two additional free parameters to the modeling, one for each dose.

Modeled electrical data was compared to measured transistor data from the commercially fabricated test reticles (the structures in leftmost box in FIG. 1a). Only low-power measurements were considered valid data for this comparison because we were limited to low-power measurements due to un-optimized thermal contact die-to-chuck. Additionally, we limited the measurements we quantitatively compared model-to-experiment to a subset that was sensitive to the location of the local degradation within the device. Model-measurement comparison data included saturation current, on resistance, Schottky diode ideality factor, drain-to-gate current ratio, and drain induced barrier lowering.

Physics of leakage processes is typically dominated by weak points in GaN, so modeling leakage processes accurately or by comparison to the present analysis was not attempted. The model does not quite match the ideality factor for either un-irradiated or the irradiated parts, which may be an issue with quantitatively modeling the physics of electron transport over the energy barrier and a limitation to any work where radiation-induced changes to the gate are of interest. Useful IV family data was collected for some but not all components because of uncontrolled oscillation (ringing) and poor control of impedance match.

TABLE 1

| | INPUTS | | | | | |
|---|---|---|---|---|---|---|
| | Unirradiated | | 2.8e13 cm$^{-2}$ Protons (TA3) | | 6.8e14 cm$^{-2}$ Protons (TA1) | |
| | No SCFP | SCFP | No SCFP | SCFP | No SCFP | SCFP |
| $R_{CS}$ (Ωmm) | 0.5 | 0.5 | 0.5 | 0.5 | V1: 5e4† V2: 10e4† | 0.5 |
| $R_{CD}$ (Ωmm) | 0.5 | 0.5 | 1.05† | 1.05† | 5e4† | 5e4† |
| $\mu_{NO}$ (cm$^2$V$^{-1}$s$^{-1}$) | 1630 | 1630 | 1110 | 1630 | 365* | 1630 |
| $\mu_O$ (cm$^2$V$^{-1}$s$^{-1}$) | 1630 | 1630 | 1630 | 1630 | 1630 | 1630 |
| $\mu_{SCFP}$ (cm$^2$V$^{-1}$s$^{-1}$) | 1630 | 1630 | 1110* | 1110* | 365* | 365* |

*From Hall effect measurement of a VdP structure with corner contacts
†Adjusted to fit experimental electrical data.

TABLE 2

| | OUTPUTS BY EXPERIMENT | | | | | |
|---|---|---|---|---|---|---|
| | Unirradiated | | 2.8e13 cm$^{-2}$ Protons (TA3) | | 6.8e14 cm$^{-2}$ Protons (TA1) | |
| | No SCFP | SCFP | No SCFP | SCFP | No SCFP | SCFP |
| DIBL $\Delta V_G/\Delta V_D$, at $I_G = 10$ nA | 0.225 | 0.25 | 0.184 | 0.199 | 0.348 | 0.009 |
| $V_G$, at $I_G = 10$ nA (V) | 0.71 | 0.70 | 0.63 | 0.67 | 0.57 | 0.63 |
| Ideality Factor, near $I_G = 10$ nA | 1.74 | 1.84 | 1.93 | 1.94 | 1.92 | 1.84 |
| $R_{ON}$, at $V_G = 0$ V (Ω) | 14.2 | 12.8 | 22.7 | 18.6 | 1.076e6 | 2.93e5 |
| $I_{Dmax}$, at $V_G = 1.5$ V $V_D = 2$ V (A) | 0.1272 | 0.1362 | 0.0833 | 0.1011 | 2.19 × 10$^{-6}$ | 7.91 × 10$^{-6}$ |
| $-I_D/I_G$ $V_G = 1.3$ V $V_D = 0$ V (%) | 23.4 | 26.1 | 23.7 | 18.1 | 53.3 | 0.00 |

TABLE 3

| | OUTPUTS BY MODEL, CONTINUED | | | | | |
|---|---|---|---|---|---|---|
| | Unirradiated | | 2.8e13 cm$^{-2}$ Protons (TA3) | | 6.8e14 cm$^{-2}$ Protons (TA1) | |
| | No SCFP | SCFP | No SCFP | SCFP | No SCFP | SCFP |
| DIBL $\Delta V_G/\Delta V_D$, at $I_G = 10$ nA | 0.273 | 0.273 | 0.222 | 0.1975 | V1: 0.397 V2: 0.554 | 0.000 |
| $V_G$, at $I_G = 10$ nA (V) | 0.67 | 0.67 | 0.67 | 0.67 | 0.67 | 0.67 |

TABLE 3-continued

OUTPUTS BY MODEL, CONTINUED

| | Unirradiated | | 2.8e13 cm$^{-2}$ Protons (TA3) | | 6.8e14 cm$^{-2}$ Protons (TA1) | |
|---|---|---|---|---|---|---|
| | No SCFP | SCFP | No SCFP | SCFP | No SCFP | SCFP |
| Ideality Factor, near $I_G$ = 10 nA | 1.49 | 1.49 | 1.49 | 1.49 | V1: 1.54 V2: 1.56 | 1.68 |
| $R_{ON}$, at $V_G$ = 0 V (Ω) | 13.3 | 13.3 | 21.3 | 18.4 | V1: 4.74e5 V2: 6.40e5 | 2.40e5 |
| $I_{Dmax}$, at $V_G$ = 1.5 V $V_D$ = 2 V (A) | 0.1343 | 0.1343 | 0.0850 | 0.0987 | 3.107 × 10$^{-6}$ | 7.705 × 10$^{-6}$ |
| $-I_D/I_G$ $V_G$= 1.3 V $V_D$ = 0 V (%) | 29.1 | 29.1 | 22.9 | 20.8 | V1: 40.0 V2: 55.5 | 0.00 |

As described herein, according to various embodiments of the present invention, a first III-V compound semiconductor and a second III-V compound semiconductor (specifically as described and illustrated herein, first and second GaN HEMTs). The second III-V compound semiconductor is similar to the first III-V compound semiconductor but further comprises a shield layer that is configured to into evaluation regions for investigation of effects resulting from irradiation, moderate proton degradation, and location-specific damage to ohmic contact resistance with sensitivity to source and drain separately. A physics based modeling approach was used to localize radiation induced degradation effects, which may be quantified via electrical outputs measured at a device level. Embodiments of the present invention may be used to evaluate extreme amounts of degradation; however, there will be some error. As provided herein, two nominally identical ohmic regions may behave differently to extreme proton dose, which suggests an opportunity to build in resiliency with further understanding of the root cause of this difference.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of evaluating localized degradation of a III-V compound semiconductor, the method comprising:
   preparing a first III-V compound semiconductor having a first shield layer thereon such that there is a first shielded portion and a first unshielded portion of the first III-V compound semiconductor;
   preparing a second III-V compound semiconductor that is similar to the first III-V compound semiconductor, the second III-V compound semiconductor having a second shield layer thereon such that there is a second shielded portion and a second unshielded portion the second III-V compound semiconductor, wherein the second shielded portion differs from the first shielded portion and the second unshielded portion differs from the first unshielded portion;
   irradiating the first and second III-V compound semiconductors so as to degrade the first and second unshielded portions;
   electrically testing a performance of each of the first and second III-V compound semiconductors; and
   comparing the performance of the first and second III-V compound semiconductors due to differences in degradation of the first and second unshielded portions.

2. The method of claim 1, wherein the first shield layer, the second shield layer, or both is constructed from a material that has a high density and a high atomic number.

3. The method of claim 2, wherein the first shield layer, the second shield layer, or both is constructed from gold, platinum, or HfO$_2$.

4. The method of claim 1, wherein the first and second III-V compound semiconductors are field-effect transistor devices.

5. The method of claim 4, wherein the field-effect transistor device is a Gallium Nitride High Electron Mobility Transistor and includes a silicon substrate, a Gallium Nitride barrier layer, an Aluminum Gallium Nitride barrier layer, a source, a drain, and a gate.

6. The method of claim 1, wherein irradiating the first and second III-V compound semiconductors includes proton beams, ion bombardment, electron beam, and radiofrequency waves.

7. The method of claim 1, further comprising:
   adjusting a power of the irradiation, a period of time for the irradiation, or both.

8. The method of claim 1, wherein electrically testing the performance includes a test selected from the group consisting of diode turn-on at various drain biases relative to a grounded source, gate capacitance as a function of gate voltage at various drain biases relative to a grounded source, radiofrequency large or small signal parameters, IV family, Hall effects, subthreshold slope/swing, and biased-light emission by Transmission Line Method structures.

9. The method of claim 1, further comprising:
   modeling, using a processor, results of electrical testing the performance of the first and second III-V compound semiconductors.

10. The method of claim 1, further comprising:
    acquiring at least one parameter from electrically testing the performance of the first and second III-V compound semiconductors, the at least one parameter selected from the group consisting of an $I_G$-$V_G$ slope, related to diode ideality factor; $I_G$ turn-on, related to Schottky barrier height and diode Richardson constant; Delta between $I_G$ turn-on, related to drain induced barrier lowering and is described from a shift in $I_G$ curves; maximum ID, related to resistance for fully-on device; a ratio of $I_G$ to $I_D$; and resistance for a partially-on device.

11. A method of evaluating localized degradation of a III-V compound semiconductor, the method comprising:
preparing a first III-V compound semiconductor having a first shield layer thereon such that there is a first shielded portion and a first unshielded portion of the first III-V compound semiconductor;
preparing a second III-V compound semiconductor that is similar to the first III-V compound semiconductor, the second III-V compound semiconductor having a second shield layer thereon such that there is a second shielded portion and a second unshielded portion of the second III-V compound semiconductor, wherein the second shielded portion differs from the first shielded portion and the second unshielded portion differs from the first unshielded portion;
irradiating the first and second III-V compound semiconductors so as to degrade the first and second unshielded portions;
electrically testing a performance of each of the first and second III-V compound semiconductors;
comparing the performance of the first III-V compound to the performance of the second III-V compound semiconductor so as to determine an effect of degradation of the first and second unshielded portions; and
modeling, using a processor, results of the performance of the first and second III-V compound semiconductors in order to deduce the and physical properties of the first and second unshielded portion.

12. The method of claim 11, wherein the first and second unshielded portions coincide with regions of interest for investigating degradation effects.

13. The method of claim 11, wherein the first shield layer, the second shield layer, for both is constructed from a material that has a high density and a high atomic number.

14. The method of claim 13, wherein the first shield layer, the second shield layer, or both is constructed from gold, platinum, or $HfO_2$.

15. The method of claim 11, wherein the first and second III-V compound semiconductors are field-effect transistor devices.

16. The method of claim 15, wherein the field-effect transistor device is a Gallium Nitride High Electron Mobility Transistor and includes a silicon substrate, a Gallium Nitride barrier layer, an Aluminum Gallium Nitride barrier layer, a source, a drain, and a gate.

17. The method of claim 11, wherein irradiating the first and second III-V compound semiconductors includes proton beams, ion bombardment, electron beam, and radiofrequency waves.

18. The method of claim 11, further comprising:
adjusting a power of the irradiation, a period of time for the irradiation, or both.

19. The method of claim 11, wherein electrically testing the performance includes a test selected from the group consisting of diode turn-on at various drain biases relative to a grounded source, gate capacitance as a function of gate voltage at various drain biases relative to a grounded source, radiofrequency large or small signal parameters, IV family, Hall effects, subthreshold slope/swing, and biased-light emission by Transmission Line Method structures.

20. The method of claim 11, further comprising:
acquiring at least one parameter from electrically testing the performance of the first and second III-V compound semiconductors, the at least one parameter selected from the group consisting of an $I_G$-$V_G$ slope, related to diode ideality factor; $I_G$ turn-on, related to Schottky barrier height and diode Richardson constant; Delta between $I_G$ turn-on, related to drain induced barrier lowering and is described from a shift in $I_G$ curves; maximum ID, related to resistance for fully-on device; a ratio of $I_G$ to $I_D$; and resistance for a partially-on device.

* * * * *